US006962869B1

(12) United States Patent
Bao et al.

(10) Patent No.: US 6,962,869 B1

(45) Date of Patent: Nov. 8, 2005

(54) SIOCH LOW K SURFACE PROTECTION LAYER FORMATION BY CXHY GAS PLASMA TREATMENT

(75) Inventors: Tien-I Bao, Hsin-chu (TW); Hsin-Hsien Lu, Hsin chu (TW); Lih-Ping Li, Hsinchu (TW); Chung-Chi Ko, Tainan (TW); Aaron Song, Hsin-Chu (TW); Syun-Ming Jang, Hsin-chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 10/270,974

(22) Filed: Oct. 15, 2002

(51) Int. Cl.[7] .......................................... H01L 21/4763

(52) U.S. Cl. ...................... 438/623; 438/633; 438/634; 438/638

(58) Field of Search ................................ 438/623, 633, 438/634, 638, FOR 111, FOR 355, FOR 489

(56) References Cited

U.S. PATENT DOCUMENTS

| | | | | |
|---|---|---|---|---|
| 6,028,015 A | | 2/2000 | Wang et al. | 438/789 |
| 6,054,398 A | * | 4/2000 | Pramanick | 438/784 |
| 6,114,259 A | | 9/2000 | Sukharev et al. | 438/789 |
| 6,159,842 A | * | 12/2000 | Chang et al. | 438/622 |
| 6,319,858 B1 | | 11/2001 | Lee et al. | 438/787 |
| 6,346,490 B1 | | 2/2002 | Catabay et al. | 438/795 |
| 6,355,563 B1 | * | 3/2002 | Cha et al. | 438/687 |
| 6,368,517 B1 | * | 4/2002 | Hwang et al. | 216/67 |
| 6,436,808 B1 | * | 8/2002 | Ngo et al. | 438/623 |
| 6,472,306 B1 | * | 10/2002 | Lee et al. | 438/623 |
| 6,668,752 B2 | * | 12/2003 | Yao | 118/723 E |
| 2001/0024769 A1 | * | 9/2001 | Donoghue et al. | 430/329 |
| 2002/0111017 A1 | * | 8/2002 | Kirkpatrick et al. | 438/638 |
| 2003/0045096 A1 | * | 3/2003 | Shioya et al. | 438/687 |

* cited by examiner

*Primary Examiner*—George Fourson
*Assistant Examiner*—Michelle Estrada
(74) *Attorney, Agent, or Firm*—Haynes and Boone, LLP

(57) ABSTRACT

A method of protecting a low k dielectric layer that is preferably comprised of a material containing Si, O, C, and H is described. The dielectric layer is subjected to a gas plasma that is generated from a $C_XH_Y$ gas which is preferably ethylene. Optionally, hydrogen may be added to the $C_xH_Y$ gas. Another alternative is a two step plasma process involving a first plasma treatment of $C_XH_Y$ or $C_XH_Y$ combined with $H_2$ and a second plasma treatment with $H_2$. The modified dielectric layer provides improved adhesion to anti-reflective layers and to a barrier metal layer in a damascene process. The modified dielectric layer also has a low CMP rate that prevents scratch defects and an oxide recess from occurring next to the metal layer on the surface of the damascene stack. The plasma treatments are preferably done in the same chamber in which the dielectric layer is deposited.

26 Claims, 5 Drawing Sheets

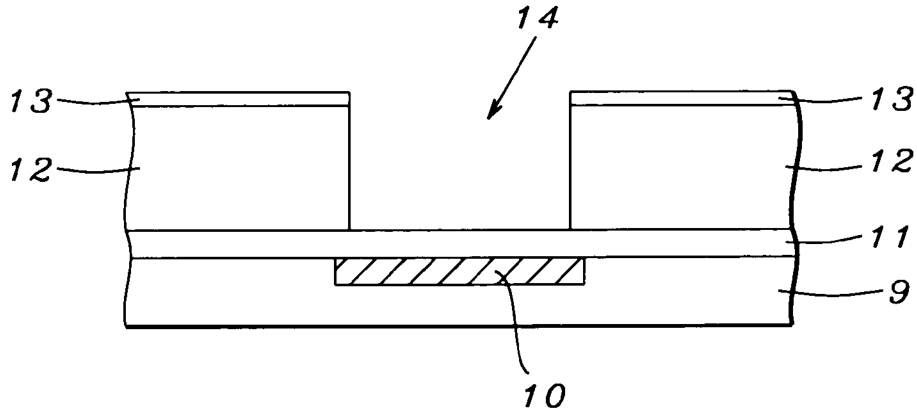
FIG. 1 - Prior Art
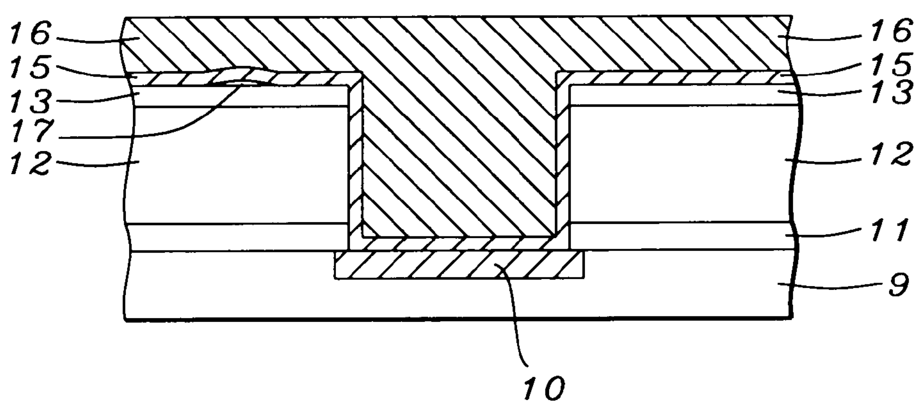
FIG. 2 - Prior Art
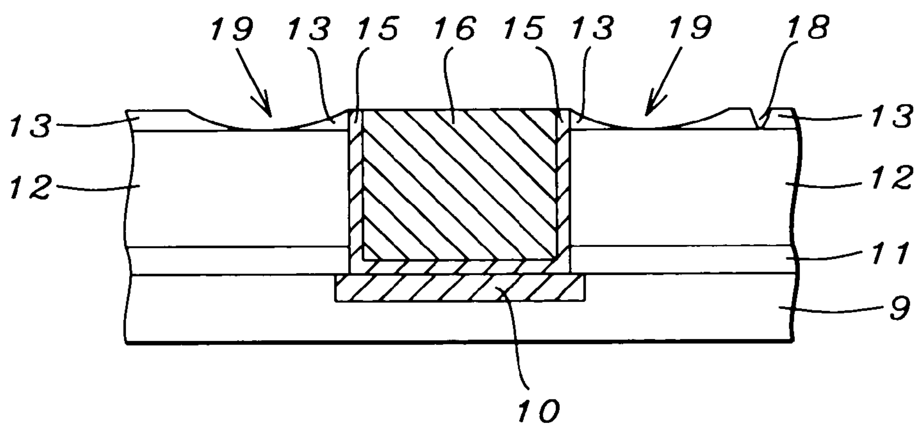
FIG. 3 - Prior Art

SIOCH LOW K SURFACE PROTECTION LAYER FORMATION BY CXHY GAS PLASMA TREATMENT

FIELD OF THE INVENTION

The invention relates to the field of fabricating integrated circuits and other electronic devices and in particular to a method of protecting a low k dielectric layer to improve adhesion to adjacent layers and to reduce defects during a subsequent chemical mechanical polish step.

BACKGROUND OF THE INVENTION

An important process during the fabrication of integrated circuits for semiconductor devices is formation of metal interconnects that provide electrical paths between conductive layers. Metal interconnects consist of trenches that provide horizontal connections between conductive features and via or contact holes that provide vertical connections between metal layers. These metal lines are separated by insulating or dielectric materials to prevent capacitance coupling or crosstalk between the metal wiring. Recent improvements in dielectric layers have involved replacing $SiO_2$ that has a dielectric constant (k) of about 4 with a low k material such as carbon doped $SiO_2$ or fluorine doped $SiO_2$ that has a k value of close to 2. The low k dielectric material has an improved insulating capability that is especially needed as the dimension between wiring shrinks in newer devices.

Another means of reducing the k value of a dielectric material is described in U.S. Pat. No. 6,319,858 where pores or air pockets are produced in the surface of inorganic materials deposited by a CVD method or in purely organic layers such as polyimides. An inert gas like $CO_2$, $N_2$, He, Ar, or ethylene is applied at high pressure such that the gas permeates into the dielectric layer and the pressure is then quickly released at a reduction rate of between 5 to 110 psi/second. For a 2000 Angstrom thick Si—O—C—F layer, pores with a 5 to 80 nm diameter are formed and the k value decreases from 2.5–2.8 to a range of 2.2 to 2.6.

A popular interconnect structure is produced by a damascene technique in which an opening such as a via hole 14 shown in FIG. 1 is etched in a stack comprised of a top etch stop layer 13, a middle dielectric layer 12, and a bottom etch stop layer 11 that has been deposited on a substrate 9. Substrate 9 is comprised of at least one conductive layer 10 in a dielectric layer (not shown). The hole pattern is initially formed in a photoresist layer (not shown) that serves as an etch mask for the pattern transfer. Optionally, an anti-reflective layer or ARL (not shown) is inserted between the photoresist and etch stop 13 to improve the process latitude of the pattern forming step.

In FIG. 2, a barrier metal layer 15 is deposited in hole 14 by a CVD method followed by deposition of a metal 16 to fill the hole. Barrier layer 15 protects metal 16 from traces of water or other chemicals contained in adjacent layers 12, 13. A chemical mechanical polish (CMP) step is subsequently used to lower the level of metal 16 and remove the horizontal portion of barrier layer 15 so that the metal 16 becomes coplanar with etch stop 13.

One problem associated with the damascene process is that etch stop layer 13 which is typically a low k material like silicon carbide or PbO does not have good adhesion to the ARL in the patterning step or to metal barrier layer 15. As a result, various types of defects occur that degrade device performance. A void 17 is shown that results from a lack of adhesion of dielectric layer 13 to barrier layer 15. Void 17 induces stress in the adjacent barrier layer which in turn causes a stress in the metal layer 16. This can lead to defects such as scratches in etch stop 13 or even in dielectric layer 12. If the defects are detected before further process steps, the substrate can be reworked but this adds considerable expense to the fabrication scheme. Even if etch stop layer 13 is omitted, low k dielectric layer 12 has poor adhesion to an ARL or metal barrier layer 15. Thus, a method is needed that provides good adhesion between a low k dielectric layer and adjacent layers such as an ARL layer and a barrier metal layer.

Another concern with etch stop layer 13 is that its CMP rate is too high which causes an oxide recess 19 around the bond pad used for the polishing as shown in FIG. 3. An uneven surface surrounding the metal layer 16 is not tolerable. For example, subsequent layers that are formed on metal layer 16 will not be planar. In the case of patterning an uneven photoresist layer, the process latitude is likely to be too small to be useful in manufacturing. Therefore, it is desirable to incorporate a method for forming a damascene structure that will prevent an oxide recess adjacent to the metal layer during a CMP step.

Furthermore, because of the poor resistance of layer 13 to CMP, there is a tendency to form scratches 18 in layer 13 that may extend into low k dielectric layer 12. These are serious defects that can result in substrate 10 being scrapped or reworked which leads to a higher cost of device production.

Three related patents describe methods for repairing damage caused by etching a via hole through a low k dielectric layer consisting of carbon containing $SiO_2$ or following a plasma etch removal of a photoresist layer on this dielectric layer. In each case, reactive Si sites are formed when Si—C bonds are broken during the etch process. These sites are sensitive to water and can form Si—OH bonds that later cleave during an annealing process. The presence of water in the via interferes with a subsequent metal deposition step. In U.S. Pat. No. 6,346,490, a plasma treatment with $N_2$ and $CH_4$ after an etch step is believed to reform Si—C bonds that prevent water uptake. Likewise, in U.S. Pat. No. 6,028,015, a $H_2$ plasma treatment forms Si—H bonds at reactive Si sites. In U.S. Pat. No. 6,114,259, exposed vertical surfaces of the dielectric layer in a via hole are treated with a $N_2$ plasma to densify the layer prior to a mild removal of a photoresist masking layer with $H_2O$ vapor plasma.

SUMMARY OF THE INVENTION

An objective of the present invention is to provide an improved damascene process in which there is good adhesion between a low k dielectric layer and an adjacent anti-reflective layer (ARL) or metal barrier layer.

A further objective of the present invention is to reduce the CMP rate of a dielectric layer so that no oxide recess is formed adjacent to the metal wiring and the amount of scratch defects are reduced.

A still further objective of the present invention is to modify the properties of a carbon doped silicon oxide layer to improve the versatility of this low k dielectric layer in different applications.

These objectives are achieved by applying a plasma treatment to a low k dielectric layer prior to the formation of a hole in the damascene stack. An etch stop layer is deposited on a substrate containing a conductive layer. Then a carbon doped oxide dielectric layer is deposited by a CVD or plasma enhanced (PECVD) method. The precursor gas may consist of a mixture of a silicon containing gas and a gas comprised of C and H or the precursor gas can be a single compound comprised of Si, C, and H and optionally oxygen. An oxygen source gas such as $N_2O$ or $O_2$ is typically added to the precursor gas.

The low k dielectric layer comprised of Si, C, H, and O is then treated with a $C_XH_Y$ gas plasma to convert some Si—O bonds in the upper region of the dielectric layer to Si—C bonds. The $C_XH_Y$ gas is preferably ethylene but may be $CH_4$, ethane, acetylene, or any hydrocarbon gas. The plasma treatment is performed in the same chamber as the low k dielectric deposition (in-situ) or in a separate chamber (ex-situ).

Conventional damascene processing is then employed to form a via hole in the stack comprised of an upper modified SiOCH dielectric layer, a middle SiOCH dielectric layer, and a lower etch stop layer. A barrier metal layer is deposited on the top dielectric layer and also forms a liner on the via walls and bottom. Because of the modified nature of the top SiOCH layer, there is good adhesion to the barrier metal. A metal that is preferably copper is deposited to fill the hole. During the CMP step to planarize the copper, there is no recess formed in the top SiOCH layer since the CMP rate for the modified layer has been reduced due to the hydrocarbon gas plasma treatment. Scratch defects are also reduced by this method.

A second embodiment also involves forming a SiOCH dielectric layer on an etch stop layer on a substrate. In this case, a mixed hydrocarbon and hydrogen gas plasma is applied to convert Si—O bonds to Si—C and Si—H bonds in the upper region of the low k dielectric layer. A modified dielectric layer is thus produced in which the properties such as dielectric constant can be adjusted by balancing the relative amount of Si—C and Si—H bond formation. The hydrogen plasma can be introduced during the hydrocarbon plasma treatment and in a subsequent plasma step.

Conventional damascene processing follows as described for the first embodiment. This method also prevents an oxide recess from occurring in the top dielectric layer during CMP and reduces the amount of scratch defects because of a lower CMP rate resulting from the plasma treatment.

BRIEF DESCRIPTION OF THE DRAWINGS

FIGS. 1–3 are cross-sectional views depicting a prior art method of forming a damascene structure.

DETAILED DESCRIPTION OF THE INVENTION

The invention is a method of protecting a low k dielectric layer comprised of a SiOCH composition to prevent defects such as scratches and an oxide recess from being formed during a chemical mechanical polish (CMP) step in a damascene process. The method also improves adhesion of the modified low k dielectric layer to adjacent layers and thereby reduces stress and related defects during processing of nearby metal layers.

Figure 4:
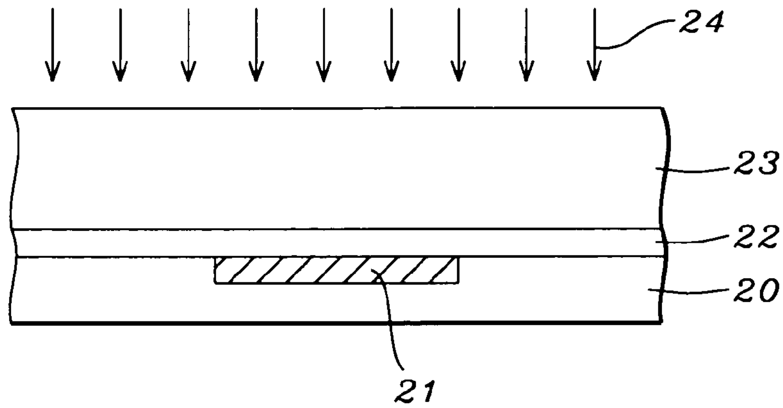
FIGS. 4–8 are cross-sectional views illustrating a damascene method according to the first embodiment of the present invention.

A first embodiment is set forth in FIGS. 4 to 8. These figures are not necessarily drawn to scale and are presented as examples and not as limitations of the scope of the present invention. Referring to FIG. 4, a substrate 20 is provided that is typically silicon and which generally contains one or more conductive layers such as layer 21 and insulating layers (not shown). The conductive layer may be separated from an adjoining insulating layer by a barrier metal layer (not shown) that forms a liner in a hole or trench to protect the conductive layer from trace amounts of moisture or chemical residues in the insulating material. A method such as a CMP step is used to planarize conductive layer 21 so that it is coplanar with the surface of substrate 20.

An etch stop layer 22 comprised of a material such as silicon nitride, silicon oxynitride, or silicon carbide is deposited by a CVD or PECVD technique on substrate 20 and conductive layer 21. Etch stop layer 22 protects conductive layer 21 from aqueous solutions and organic solvents that are used in subsequent process steps.

A low k dielectric layer 23 is then formed on etch stop layer 22 and is comprised of a SiOCH material that is deposited by CVD or PECVD. The Si gas precursor may be separate from the $C_MH_N$ precursor in the deposition process or a precursor gas containing Si, C, H, and optionally O may be employed. Typically, an oxygen precursor gas such as $N_2O$ or $O_2$ is also added to the gas mixture during the deposition. Optionally, an inert carrier gas such as Ar, $N_2$, or He can be used to transport the Si precursor into the process chamber if the precursor is a liquid with a high boiling point. The low k dielectric layer 23 that contains Si, O, C, and H is also referred to as a carbon doped oxide layer. The carbon and hydrogen content in the low k dielectric layer 23 lowers the dielectric constant (k) relative to $SiO_2$ itself.

In many damascene processes, a passivation layer such as etch stop layer 13 in FIG. 1 is added on the low k dielectric layer to serve as an etch stop for a later CMP step. However, etch stop layer 13 which is a material such as PbO or silicon carbide suffers from poor adhesion to adjoining layers and has a high CMP removal rate that leads to an oxide recess or scratch defects as shown in FIG. 3.

Figure 5:
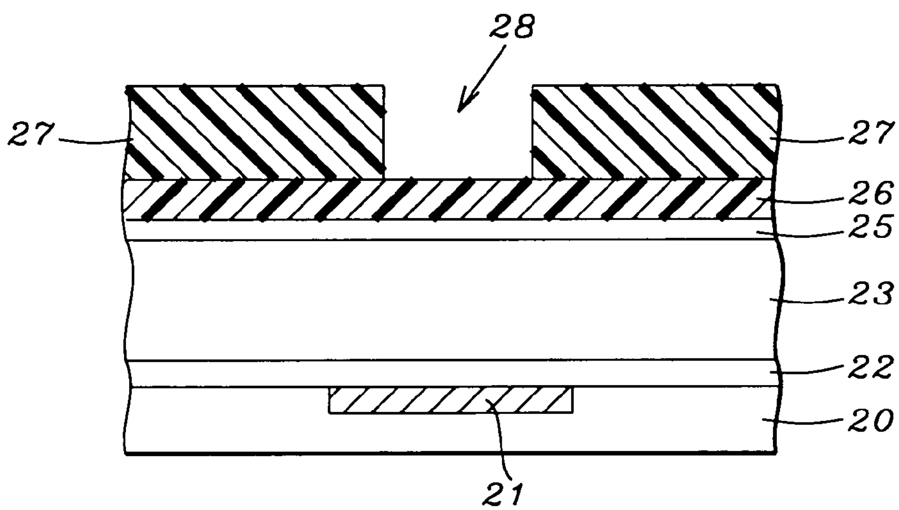

A key feature of this invention is the treatment of the carbon doped oxide layer 23 with a hydrocarbon plasma 24 as illustrated in FIG. 4. The gas for generating the plasma 24 is preferably ethylene but can be other $C_XH_Y$ gases including $CH_4$, ethane, and acetylene. Conditions for the treatment are a hydrocarbon flow rate of 10 to 10000 standard cubic centimeters per minute (sccm), a chamber pressure of from 0.1 mTorr to 100 Torr, a temperature of from 100° C. to 500° C., and a RF power of 10 to 1000 Watts. The time period of the plasma treatment can vary but is preferably from about 0.1 seconds to 100 seconds. The plasma 24 is believed to replace Si—O bonds in the upper region of low k dielectric layer with Si—C bonds to form a modified dielectric layer 25 as shown in FIG. 5. Preferably, the plasma 24 is generated in the same process chamber (in-situ) where low k dielectric layer 23 is deposited. However, plasma 24 can be generated in a separate chamber to provide the same benefits as an in-situ process.

The thickness of modified low k dielectric layer 25 may vary depending on the plasma treatment conditions. However, the combined thickness of low k dielectric layer 23, and modified low k dielectric layer 25 is equivalent to the thickness of the low k dielectric layer 23 prior to the treatment. One benefit of the plasma treatment 24 is that modified low k dielectric layer 25 has a lower dielectric constant than the low k dielectric layer 23 because of a higher carbon content. Another improvement is that the CMP removal rate of modified low k dielectric layer 25 is low relative to commonly used etch stop layers. For example, after low k dielectric layer 23 is treated with an ethylene plasma with the conditions described above for a period of 30 seconds, the polish rate during the CMP step is reduced to only 80 Angstroms per minute compared to 300 Angstroms per minute for untreated low k dielectric layer 23 and 50 Angstroms per minute for silicon carbide. Additional advantages provided by a modified low k dielectric layer 25 will become apparent during a description of subsequent process steps.

A conventional patterning process is now performed to create an opening in the low k dielectric layer 23, and in modified low k dielectric layer 25. Although FIGS. 5–8 depict a single damascene method, the formation of an opening 28 in FIG. 5 could also represent part of a dual damascene sequence. First, an optional anti-reflective layer (ARL) 26 is coated on modified low k dielectric layer 25. The ARL 26 may be a CVD deposited material like silicon oxynitride or an organic solution containing a polymer that is spin coated and baked to form ARL 26. Although the insertion of an ARL adds cost to the fabrication scheme, the savings realized by achieving a larger process window in a subsequent photoresist patterning step normally more than offsets the cost of an extra layer. The inventors have found that the adhesion of ARL 26 to modified low k dielectric layer 25 is a significant improvement over ARL adhesion to traditional etch stop layers such as silicon carbide in etch stop layer 13 in FIG. 1. Next a photoresist layer 27 is formed on ARL 26 and is patterned to produce an opening 28 that can be a via hole or a trench. The width of opening 28 is typically sub-micron in size and may be as small as 100 nm or less in advanced products. In general, the height of opening 28 is about 3 to 4 times the width of the opening but can vary depending on the application and the type of photoresist layer 27.

Figure 6:
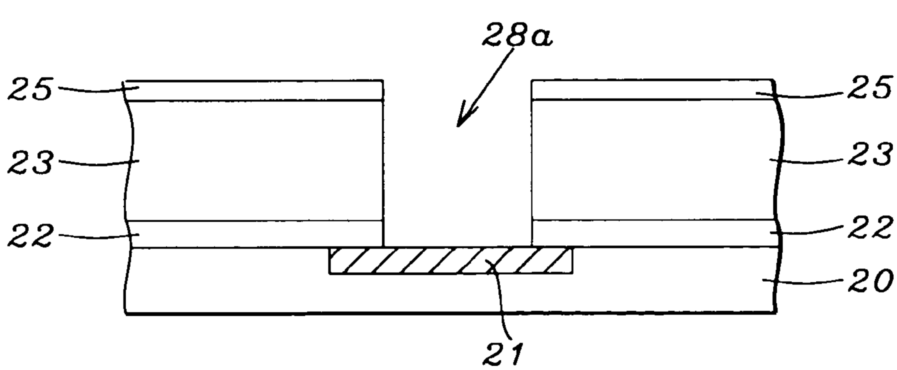

Referring to FIG. 6, opening 28 is transferred through ARL 26 by means of a plasma etch that usually includes oxygen and a fluorocarbon like $CF_4$. Photoresist layer 27 then serves as an etch mask while the hole pattern is plasma etched through low k dielectric layer 23, and modified low k dielectric layer 25 using a gas mixture that is comprised of a fluorocarbon. ARL 26 and photoresist layer 27 are then stripped by conventional means to leave opening 28*a*. Next, etch stop layer 22 which is exposed by opening 28*a* is removed by a standard etch procedure to expose conductive layer 21. A cleaning step known to those skilled in the art may be employed here to remove any residues on the surface of conductive layer 21.

Figure 7:
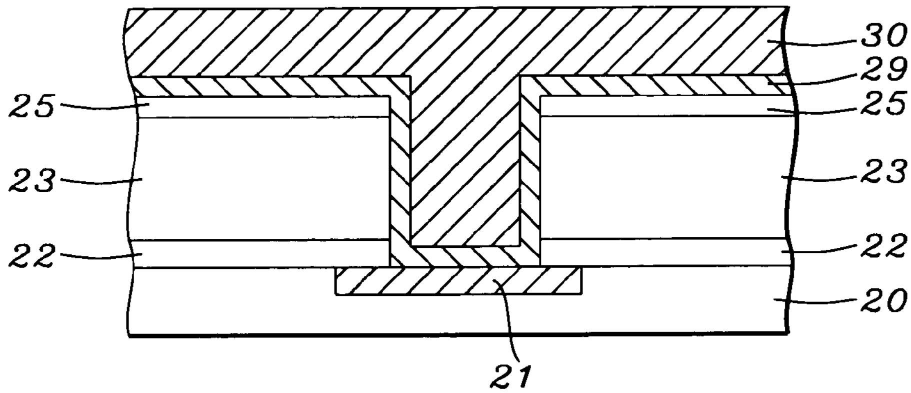

In FIG. 7, a barrier metal is deposited by a CVD or PECVD technique to form a barrier metal layer 29. Barrier metal layer 29 is preferably TaN but can also be selected from a group including TiN, WN, Ti, Ta, W, or TaSiN. The barrier metal layer 29 is formed on modified low k dielectric layer 25 and also forms a liner on the walls and bottom of opening 28*a*. Because of the treatment with a hydrocarbon plasma 24 in a prior step, the adhesion of modified low k dielectric layer 25 to barrier metal layer 29 is improved compared to the adhesion of a conventional etch stop layer like silicon carbide to the barrier metal layer 29. Improved adhesion to barrier metal layer 29 prevents scratching or peeling of the low k dielectric layer 23, and modified low k dielectric layer 25 during a later CMP step. A metal layer 30 that is preferably copper but may also be a copper alloy, aluminum, or an aluminum alloy is deposited by an electroplating, evaporating, or sputtering process to fill opening 28*a*. Metal layer 30 also forms on horizontal surfaces of barrier metal layer 29.

Figure 8:
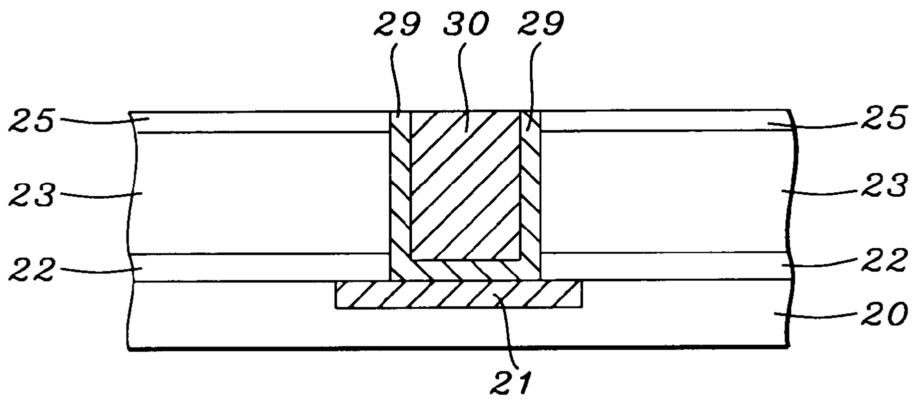

Referring to FIG. 8, a polishing method such as a CMP step is employed to planarize metal layer 30 such that it becomes coplanar with modified low k dielectric layer 25. Since the CMP removal rate of the modified low k dielectric layer 25 is only 80 Angstroms per minute because of the plasma treatment 24, there is no oxide recess or dishing on the surface adjacent to metal layer 30. Furthermore, the low polish rate of the modified low k dielectric layer 25 avoids scratch defects that can lower device performance or that result in expensive repair. The method is versatile in that it can be employed with a variety of ARL materials and with different barrier metal layers.

Figure 9:
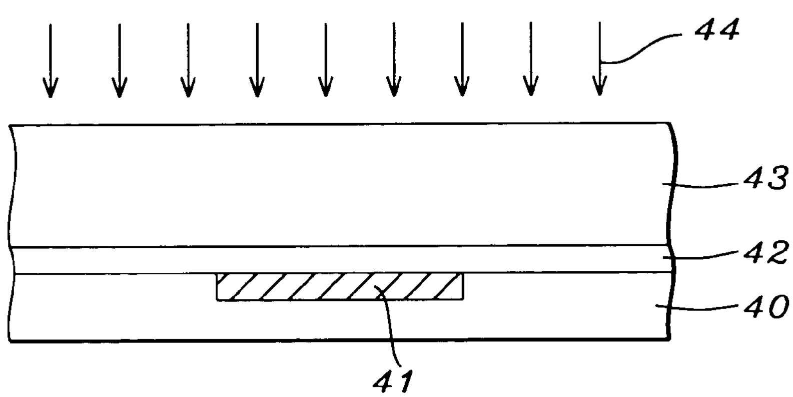
FIGS. 9–13 are cross-sectional views showing a damascene method according to the second embodiment of the present invention.

A second embodiment is illustrated in FIGS. 9 to 13 in which a plasma treatment to modify a low k dielectric layer is comprised of two gases that can act together or separately. Referring to FIG. 9, a substrate 40 is provided that is typically silicon and which generally contains one or more conductive layers such as layer 41 and insulating layers (not shown). The conductive layer may be separated from an adjoining insulating layer by a barrier metal layer (not shown) that forms a liner in a hole or trench to protect the conductive layer from trace amounts of moisture or chemical residues in the insulating material. A CMP step is used to planarize conductive layer 41 so that it is coplanar with the surface of substrate 40.

An etch stop layer 42 comprised of a material such as silicon nitride, silicon oxynitride, or silicon carbide is deposited by a CVD or PECVD technique on substrate 40 and conductive layer 41. Etch stop layer 42 protects conductive layer 41 from aqueous solutions and organic solvents that are used in subsequent process steps.

A low k dielectric layer 43 is then formed on etch stop layer 42 and is comprised of a SiOCH material that is deposited by CVD or PECVD. The Si gas precursor may be separate from the $C_MH_N$ precursor in the deposition process or a precursor gas containing Si, C, H, and optionally O may be employed. Typically, an oxygen precursor gas such as $N_2O$ or $O_2$ is also added to the gas mixture during the deposition. Optionally, an inert carrier gas such as Ar, $N_2$, or He can be used to transport the Si precursor into the process chamber if the precursor is a liquid with a high boiling point. The low k dielectric layer 43 that contains Si, O, C, and H is also referred to as a carbon doped oxide layer. The carbon and hydrogen content in the low k dielectric layer 43 lowers the dielectric constant (k) relative to $SiO_2$ itself.

In many damascene processes, a passivation layer such as etch stop layer 13 in FIG. 1 is added on the low k dielectric layer to serve as a polish stop for a later CMP step. However, etch stop layer 13 which is a material such as PbO or silicon carbide suffers from poor adhesion to adjoining layers and has a high CMP removal rate that leads to an oxide recess or scratch defects as shown in FIG. 3.

A key feature of this invention is the treatment of the carbon doped oxide layer 43 with a plasma 44 as illustrated in FIG. 9. Plasma 44 is comprised of either a hydrocarbon gas or a hydrocarbon gas in combination with hydrogen. The preferred hydrocarbon gas for plasma 44 is ethylene but other $C_XH_Y$ gases including $CH_4$, ethane, and acetylene can be used, instead. Conditions for the plasma treatment are the same as described for plasma 24 in the first embodiment when only a hydrocarbon gas is employed. Conditions for a mixed gas plasma 44 are a hydrocarbon flow rate of 10 to 10000 sccm, a hydrogen flow rate of 10 to 1000 sccm, a chamber pressure of from 0.1 mTorr to 100 Torr, a temperature of from 100° C. to 500° C., and a RF power of 10 to 1000 Watts. The time period of the plasma treatment can vary but is preferably from about 0.1 seconds to 100 seconds.

Figure 10:
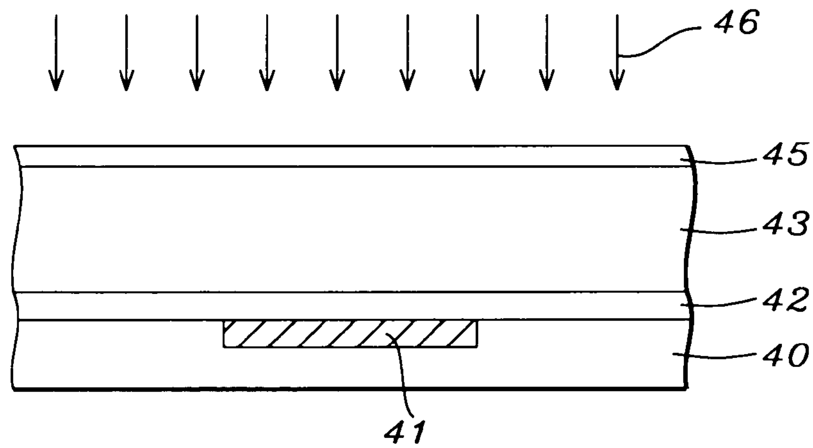

The hydrocarbon component of plasma 44 is believed to replace Si—O bonds in the upper region of low k dielectric layer 43 with Si—C bonds and the hydrogen component replaces Si—O bonds with Si—H bonds to form a modified low k dielectric layer 45 as shown in FIG. 10. Preferably, the plasma 44 is generated in the same process chamber (in-situ) where low k dielectric layer 43 is deposited. However, plasma 44 can be generated in a separate chamber to provide the same benefits as an in-situ process. The relative amounts of hydrogen and hydrocarbon gases supplied to the process chamber can be adjusted to provide different ratios of Si—C/Si—H bond formation and thereby adjust the properties of the modified low k dielectric layer 45.

Optionally, a second plasma treatment is performed that involves generating a plasma 46 comprised of hydrogen gas as depicted in FIG. 10. The second treatment is preferably performed in the same process chamber as the first treatment with plasma 44. Conditions for generating plasma 46 are a hydrogen flow rate of 10 to 1000 sccm, a power of 10 to 1000 Watts, a chamber pressure of 0.1 mTorr to 100 Torr, and a temperature between 10° C. and 500° C. for a period of about 0.1 to 100 seconds. As a result, the modified low k dielectric layer 45 is further modified to provide a modified low k dielectric layer 47 in FIG. 11. The process alternatives are summarized in Table 1 and the effect on properties are listed.

TABLE 1

Variations of Plasma Treatments and Resulting Properties of Modified Dielectric Layer

| | Plasma 44 flow rate | Plasma 44 time | Plasma 46 flow rate | Plasma 46 time | Layer 47 CMP rate |
|---|---|---|---|---|---|
| Sequence 1 | 500 sccm $C_XH_Y$ | 20 sec. | 500 sccm $H_2$ | 20 sec. | 100 Angstroms per sec. |
| Sequence 2 | 500 sccm $C_XH_Y$ + 500 sccm $H_2$ | 20 sec. | none | — | 80 Angstroms per sec. |
| Sequence 3 | 500 sccm $C_XH_Y$ + 500 sccm $H_2$ | 20 sec. | 500 sccm $H_2$ | 20 sec. | 200 Angstroms per sec. |

The thickness of the modified low k dielectric layer 47 may vary depending on the plasma treatment conditions. However, the combined thickness of low k dielectric layer 43, and modified low k dielectric layer 47 is equivalent to the thickness of the low k dielectric layer 43 prior to the treatment. When plasma 46 is omitted as in sequence 2 in Table 1, the modified low k dielectric layer 45 is the end result rather than a modified low k dielectric layer 47. One benefit of the modified low k dielectric layer 47 is a lower dielectric constant than the low k dielectric layer 43 because of a higher carbon and hydrogen content. Another improvement is that the CMP removal rate of the modified low k dielectric layer 47 is low relative to commonly used etch stop layers. As shown in Table 1, the CMP removal rate for the modified low k dielectric layer 47 is as low as 80 Angstroms per minute compared to 300 Angstroms per minute for untreated low k dielectric layer 43 and 50 Angstroms per minute for silicon carbide. Additional advantages provided by the modified low k dielectric layer 47 will become apparent during a description of subsequent process steps.

Figure 11:
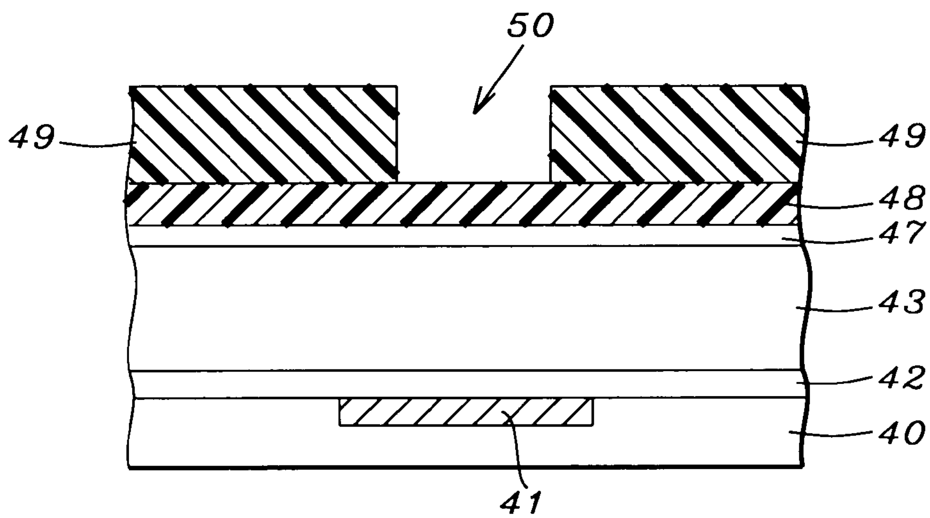

Referring to FIG. 11, a conventional patterning process is now performed in order to create an opening in the low k dielectric layer 43, and in modified low k dielectric layer 47. Although FIGS. 9–13 depict a single damascene method, the formation of an opening 50 could also represent part of a dual damascene sequence. First, an optional anti-reflective layer (ARL) 48 is coated on the modified low k dielectric layer 47. The ARL 48 may be a CVD deposited material like silicon oxynitride or an organic solution containing a polymer that is spin coated and baked to form ARL 48. Although the insertion of an ARL adds cost to the fabrication scheme, the savings realized by achieving a larger process window in a subsequent photoresist patterning step normally more than offsets the cost of an extra layer. The inventors have found that the adhesion of ARL 48 to the modified low k dielectric layer 47 is a significant improvement over ARL adhesion to traditional etch stop layers such as silicon carbide in etch stop layer 13 in FIG. 1. Next a photoresist layer 49 is formed on ARL 48 and is patterned to produce an opening 50 that can be a via hole or a trench. The width of opening 50 is typically sub-micron in size and may be as small as 100 nm or less in advanced products. In general, the height of opening 50 is about 3 to 4 times the width but can vary depending on the application and the type of photoresist layer 49.

Figure 12:
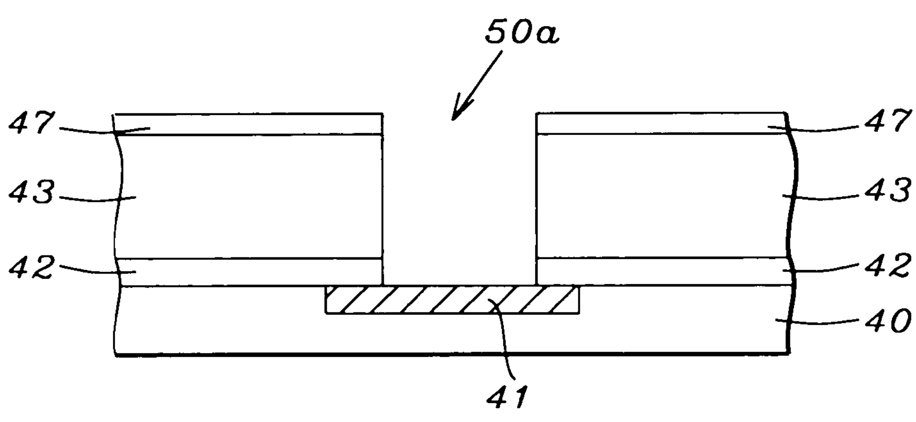

Referring to FIG. 12, opening 50 is transferred through ARL 48 by means of a plasma etch that usually includes oxygen and a fluorocarbon like $CF_4$. Photoresist layer 49 then serves as an etch mask while the hole pattern is plasma etched through the low k dielectric layer 43, and the modified low k dielectric layer 47 using a gas mixture that is typically comprised of a fluorocarbon. ARL 48 and photoresist layer 49 are then stripped by conventional means to leave opening 50*a*. Next, etch stop layer 42 which is exposed by opening 50*a* is removed by a standard etch procedure to expose conductive layer 41. A cleaning step known to those skilled in the art may be employed here to remove any residues on the surface of conductive layer 41.

Figure 13:
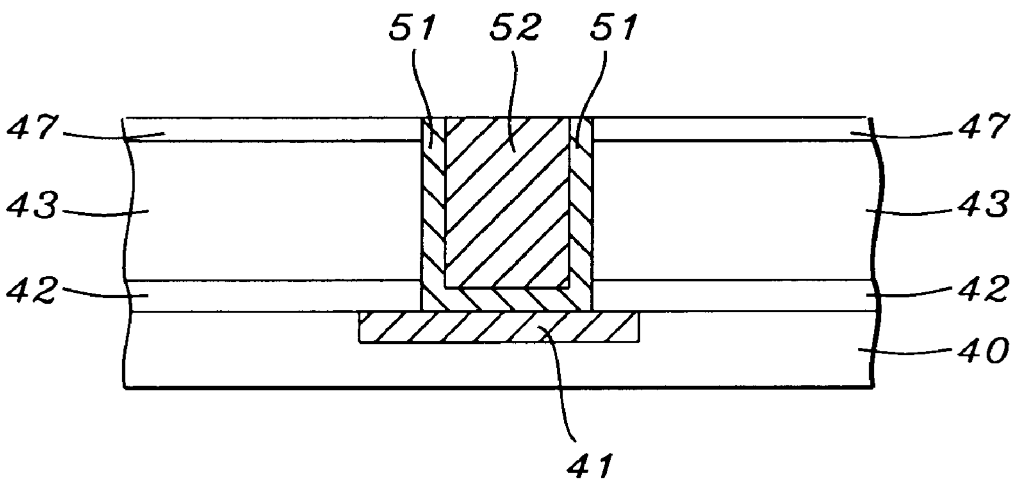

In FIG. 13, a barrier metal is deposited by a CVD or PECVD technique to form a barrier metal layer 51. Barrier metal layer 51 is preferably TaN but can also be selected from a group including TiN, WN, Ti, Ta, W, and TaSiN. The barrier metal layer 51 is formed on modified low k dielectric layer 47 and also forms a liner on the walls and bottom of opening 50*a*. Because of the treatment with a hydrocarbon and hydrogen plasma 44, 46 in a prior step, the adhesion of modified low k dielectric layer 47 to barrier metal layer 51 is improved compared to the adhesion of a conventional etch stop layer like silicon carbide to the barrier metal layer 51. Improved adhesion to barrier metal layer 51 prevents scratching or peeling of the low k dielectric layer 43, and the modified low k dielectric layer 47 during a later CMP step.

A metal layer 52 that is preferably copper but may also be a copper alloy, aluminum, or an aluminum alloy is deposited by an electroplating, evaporating, or sputtering process to fill opening 50*a*. Metal layer 52 also forms on horizontal surfaces of barrier metal layer 51. A CMP step is employed to planarize metal layer 52 such that it becomes coplanar with modified low k dielectric layer 47. Since the CMP removal rate of the modified low k dielectric layer 47 is only about 80 Angstroms per minute because of the plasma treatments, there is no oxide recess or dishing on the surface adjacent to metal layer 52. Furthermore, the low polish rate of the modified low k dielectric layer 47 avoids scratch defects that can lower device performance or that leads to expensive repair. The method is versatile in that modified low k dielectric layer 47 can be employed with a variety of ARL materials and barrier metal layers. In addition, the properties of the modified low k dielectric layer 47 can be optimized for a particular application by adjusting the relative amount of Si—C and Si—H bond formation during the plasma treatments.

While this invention has been particularly shown and described with reference to, the preferred embodiments thereof, it will be understood by those skilled in the art that various changes in form and details may be made without departing from the spirit and scope of this invention.

We claim:

1. A surface protection method for a low k dielectric layer comprising:

providing a substrate;

forming a silicon containing low k dielectric layer on said substrate;

subjecting said silicon containing low-k dielectric layer to a carbon containing gas plasma treatment in a process chamber to form a modified silicon containing low k dielectric layer with an increased number of Si—C bonds at the top of said silicon containing low k dielectric layer prior to subsequent processing, wherein the top of said modified silicon containing low k dielectric layer has a lower polishing rate than said silicon containing low k dielectric layer; and performing a second plasma treatment involving hydrogen after said carbon containing gas plasma treatment.

2. The method of claim 1 wherein said carbon containing gas plasma is generated from ethylene or from one of $CH_4$, ethane, acetylene, and other $C_XH_Y$ gases.

3. The method of claim 1 wherein said carbon containing gas has a flow rate from 10 to 1000 sccm, and the process chamber has a pressure between 0.1 mTorr and 100 Torr, an RF power from 10 to 1000 Watts, and a temperature between 100° C. and 500° C. for a period of about 0.1 to 100 seconds.

4. A surface protection method for a low k dielectric layer comprising:

providing a substrate;

forming a silicon containing low k dielectric layer on said substrate; and subjecting said silicon containing low-k dielectric layer to a carbon containing gas plasma treatment in a process chamber to form a modified silicon containing low k dielectric layer with an increased number of Si—C bonds at the top of said silicon containing low k dielectric layer prior to subsequent processing, wherein the top of said modified silicon containing low k dielectric layer has a lower polishing rate than said silicon containing low k dielectric layer;

wherein hydrogen gas is added to said carbon containing gas.

5. The method of claim 4 further comprised of performing a second plasma treatment involving hydrogen after said carbon containing gas plasma treatment.

6. The method of claim 1 wherein said carbon containing gas plasma is generated in the same process chamber in which said silicon containing low k dielectric layer is deposited.

7. The method of claim 1 wherein said carbon containing gas plasma is generated in a separate process chamber in which said silicon containing low k dielectric layer is deposited.

8. A surface protection method for a low k dielectric layer comprising:

providing a substrate;

forming a silicon containing low k dielectric layer on said substrate;

subjecting said silicon containing low-k dielectric layer to a carbon containing gas plasma treatment in a process chamber to form a modified silicon containing low k dielectric layer with an increased number of Si—C bonds at the top of said silicon containing low k dielectric layer prior to subsequent processing, wherein the top of said modified silicon containing low k dielectric layer has a lower polishing rate than said silicon containing low k dielectric layer; and forming an anti-reflective layer (ARL) or barrier layer on said modified silicon containing low k dielectric layer.

9. The method of claim 8 wherein the adhesion of said ARL or barrier layer to said modified silicon containing low k dielectric layer is better than the adhesion of said ARL or barrier layer to said silicon containing low k dielectric layer before said plasma treatment.

10. A damascene method comprising:

(a) providing a substrate;

(b) forming a silicon containing low k dielectric layer on said substrate;

(c) subjecting said silicon containing low k dielectric layer to a carbon containing gas plasma treatment in a process chamber to form a modified silicon containing low k dielectric layer with an increased number of Si—C bonds at the top of said silicon containing low k dielectric layer;

(d) forming an opening in said modified silicon containing low k dielectric layer, and in said silicon containing low k dielectric layer;

(e) depositing a barrier layer in said opening; and (f) forming a conductive layer on said barrier layer to fill said opening.

11. The method of claim 10 further comprised of forming an etch stop layer on said substrate before step (b) wherein the etch stop layer is silicon nitride, silicon oxynitride, or silicon carbide.

12. The method of claim 10 wherein said carbon containing plasma is generated from ethylene or from one of $CH_4$, ethane, acetylene, and other $C_XH_Y$ gases.

13. The method of claim 10 wherein said carbon containing gas has a flow rate from 10 to 1000 sccm, and the process chamber has a pressure between 0.1 mTorr and 100 Torr, an RF power from 10 to 1000 Watts, and a temperature between 100° C. and 500° C. for a period of about 0.1 to 100 seconds.

14. The method of claim 10 further comprised of adding hydrogen gas to the carbon containing gas in the process chamber.

15. The method of claim 10 further comprised of performing a second plasma treatment involving hydrogen after the carbon containing gas plasma treatment.

16. The method of claim 14 further comprised of performing a second plasma treatment involving hydrogen after the carbon containing gas plasma treatment.

17. The method of claim 10 wherein said carbon containing gas plasma is generated in the same process chamber in which said silicon containing low k dielectric layer is deposited.

18. The method of claim 10 wherein the opening is a via hole or trench in a single damascene process.

19. The method of claim 10 wherein said opening is comprised of a trench formed above a via hole in a dual damascene process.

20. The method of claim 11 wherein the opening is formed by a process comprising:

(a) depositing an anti-reflective layer (ARL) on said modified silicon containing low k dielectric layer;

(b) coating and patterning a photoresist on said ARL; and (c) etch transferring said pattern through said ARL, modified silicon containing low k dielectric layer, silicon containing low k dielectric layer, and through said etch stop layer.

21. The method of claim 20 wherein the adhesion of said ARL to said modified silicon containing low k dielectric layer is better than the adhesion of said ARL to said silicon containing low k dielectric layer when no plasma treatment is performed.

22. The method of claim 10 wherein the barrier layer is TaN.

23. The method of claim 10 wherein the conductive layer is comprised of copper.

24. The method of claim 10 further comprised of planarizing said conductive layer to be coplanar with said modified silicon containing low k dielectric layer wherein the planarization is accomplished with a chemical mechanical polish step.

25. The method of claim 24 wherein the polish rate of said modified silicon containing low k dielectric layer is less than the polish rate for said silicon containing low k dielectric layer.

26. A surface protection method for a low-k dielectric layer comprising:

providing a substrate;

forming a silicon containing low-k dielectric layer on said substrate;

subjecting said silicon containing low-k dielectric layer to a carbon containing gas treatment in a process chamber to form a modified silicon containing low-k dielectric layer with an increased number of Si—C bonds at the top of said silicon containing low-k dielectric layer prior to subsequent processing, wherein said carbon containing gas treatment includes providing a carbon containing gas in said process chamber and applying energy to said carbon containing gas, and wherein the top of said modified silicon containing low-k dielectric layer has a lower polishing rate than said silicon containing low-k dielectric layer; and forming an anti-reflective layer (ARL) or barrier layer on said modified silicon containing low-k dielectric layer.

* * * * *